United States Patent [19]

I'Anson et al.

[11] Patent Number: 5,389,882
[45] Date of Patent: Feb. 14, 1995

[54] LAN MEASUREMENT APPARATUS FOR DETERMINING VOLTAGE BETWEEN PACKETS

[75] Inventors: Colin S. I'Anson; Peter Phaal, both of Bristol, England

[73] Assignee: Hewlett-Packard Company, Palo Alto, Calif.

[21] Appl. No.: 66,140

[22] Filed: Jun. 1, 1993

[30] Foreign Application Priority Data

Dec. 7, 1990 [EP] European Pat. Off. ........... 90313319

[51] Int. Cl.⁶ .......................... G01R 31/08; H04J 1/16
[52] U.S. Cl. ..................... 324/522; 370/13; 371/20.1
[58] Field of Search ............... 324/522, 523; 370/527, 370/13, 17, 85.2, 85.3; 371/20.1

[56] References Cited

U.S. PATENT DOCUMENTS

| | | |
|---|---|---|
| 4,799,211 | 1/1989 | Felker et al. |
| 5,179,341 | 1/1993 | Whiteside ............... 370/13 |
| 5,185,735 | 2/1993 | Ernst ...................... 370/13 |
| 5,198,805 | 3/1993 | Whiteside et al. ..... 370/17 |
| 5,331,628 | 7/1994 | Cheng et al. ........... 371/20.1 |
| 5,333,147 | 7/1994 | Nohara et al. ......... 370/13 |

FOREIGN PATENT DOCUMENTS 383291 8/1990 European Pat. Off. .
2106358 4/1983 United Kingdom .

OTHER PUBLICATIONS

Mesures Regulation Automatisme, vol. 53, No. 11, Oct. 1988 (Paris, FR) "Ethernet bas les masques", pp. 41–42, See p. 41, right–hand column, lines 15–19.
Computer, vol. 15, No. 8, Aug. 1982 (Long Beach, US) J. P. Shoch et al.: "Evolution of the ethernet local computer network", pp. 10–27, see p. 15.

Primary Examiner—Maura K. Regan

[57] ABSTRACT

An LAN parameter measuring instrument is provided for measuring at least one physical parameter of a wired, packet based, baseband LAN. The instrument comprises input means for providing a connection to the LAN transmission medium to enable measurements to be made while the LAN is active and voltage measuring means arranged to connect to the LAN transmission medium through said input means and operative to measure the voltage on the LAN transmission medium during inter-packet gaps. The instrument may determine the resistance of the LAN by measuring the inter-packet voltage during the injection of a known current into the transmission medium.

16 Claims, 2 Drawing Sheets

LAN MEASUREMENT APPARATUS FOR DETERMINING VOLTAGE BETWEEN PACKETS

TECHNICAL FIELD

The present invention relates to apparatus for measuring at least one physical parameter of a wired, packet-based, baseband local area network (LAN) while the LAN is active.

BACKGROUND ART

The term "wired, packet-based. baseband LAN" is intended to mean a LAN, or LAN segment, in which the LAN transmission medium (for example, twisted pair wiring, coaxial cable) is adapted to carry electrical signals and in which the data being transferred between stations is transmitted over the transmission medium in packets using baseband signalling techniques. Such wired, packet-based, baseband LANs are referred to below as LANs of the "aforesaid type".

LANs of the aforesaid type may use various media access control techniques including CSMA/CD, token passing and slotted ring but all have the general characteristic that signals are normally only present on the LAN when user data or control data is being transferred - that is, no signals are normally present in the gaps between packets ("inter-packet" gaps).

The majority of faults on LANs of the aforesaid type are very simple and are typically caused by the failure of a particular component such as a network node, spanning device (bridge), or the wires or cables (or their terminators) themselves. In diagnosing network faults, it is therefore useful to be able to make simple observations of the state of any particular segment of a LAN.

It is an object of the present invention to provide apparatus which by simple measuremnts, can substantially facilitate fault diagnosis on LANs of the aforesaid type.

DISCLOSURE OF THE INVENTION

According to one aspect of the present invention, there is provided apparatus for measuring at least one physical parameter of a wired, packet-based, baseband LAN, the apparatus comprising input means for providing a connection to the transmission medium of the LAN to enable measurements to be made while the LAN is operational, and voltage measuring means arranged to connect to the LAN transmission medium through the input means and operative to pick out and provide a measure of the voltage that is present on the LAN transmission medium during inter-packet gaps.

The voltage on the LAN during inter-packet gaps is a useful measurement as it permits the user to tell whether any of the stations connected to the LAN are malfunctioning by leaking current into the LAN. The ability to measure inter-packet voltage also permits the resistance of the transmission medium to be measured as will be explained below.

The voltage measuring means may comprise packet-detecting means for detecting the presence of a packet on the LAN and sample-and-hold means controlled by the packet-detecting means to capture the voltage on the LAN transmission medium when a packet is not present. Advantageously, the sample-and-hold means samples the voltage on the LAN a predetermined time interval after the end of the last preceding packet.

Alternatively, for LANs in which the mean voltage on the LAN transmission medium during passage of a packet differs from that present between packets, the voltage measuring means may comprise a peak voltage detector operative to capture the peak voltage on the LAN transmission medium in a direction opposite to the direction of excursion of the mean voltage during passage of a packet relative to the mean voltage between packets. Where the voltage excursions on the LAN during passage of a packet are all in the same direction with respect to the voltage of the LAN between packets, then the peak voltage detector can simply measure instantaneous peak voltage.

As already noted, the ability to measure the inter-packet voltage facilitates the measurement of the resistance of the LAN transmission medium. This is achieved by providing the apparatus with current injection means for injecting a known current into the transmission medium, and processor means connected to said voltage measuring means to determine from the inter-packet voltage measured thereby during injection of said known current by said current injection means, and from the magnitude of said known current, the resistance presented by the LAN transmission medium.

Measurement of the resistance of the LAN transmission medium readily shows whether a terminator has been left off or whether the medium has been incorrectly terminated. For simplicity, the current injection means can be manually controlled to effect current insertion and the value of the injected current is pre-programmed into the processor means.

Conveniently, the measuring apparatus is provided in hand-held form enabling a technician to move rapidly from one location to another to isolate a network fault.

BRIEF DESCRIPTION OF THE DRAWINGS

A hand-portable, LAN parameter-measuring instrument embodying the invention will now be particularly described, by way of non-limiting example, with reference to the accompanying diagrammatic drawings, in which.

BEST MODE FOR CARRYING OUT THE INVENTION

Figure 1:
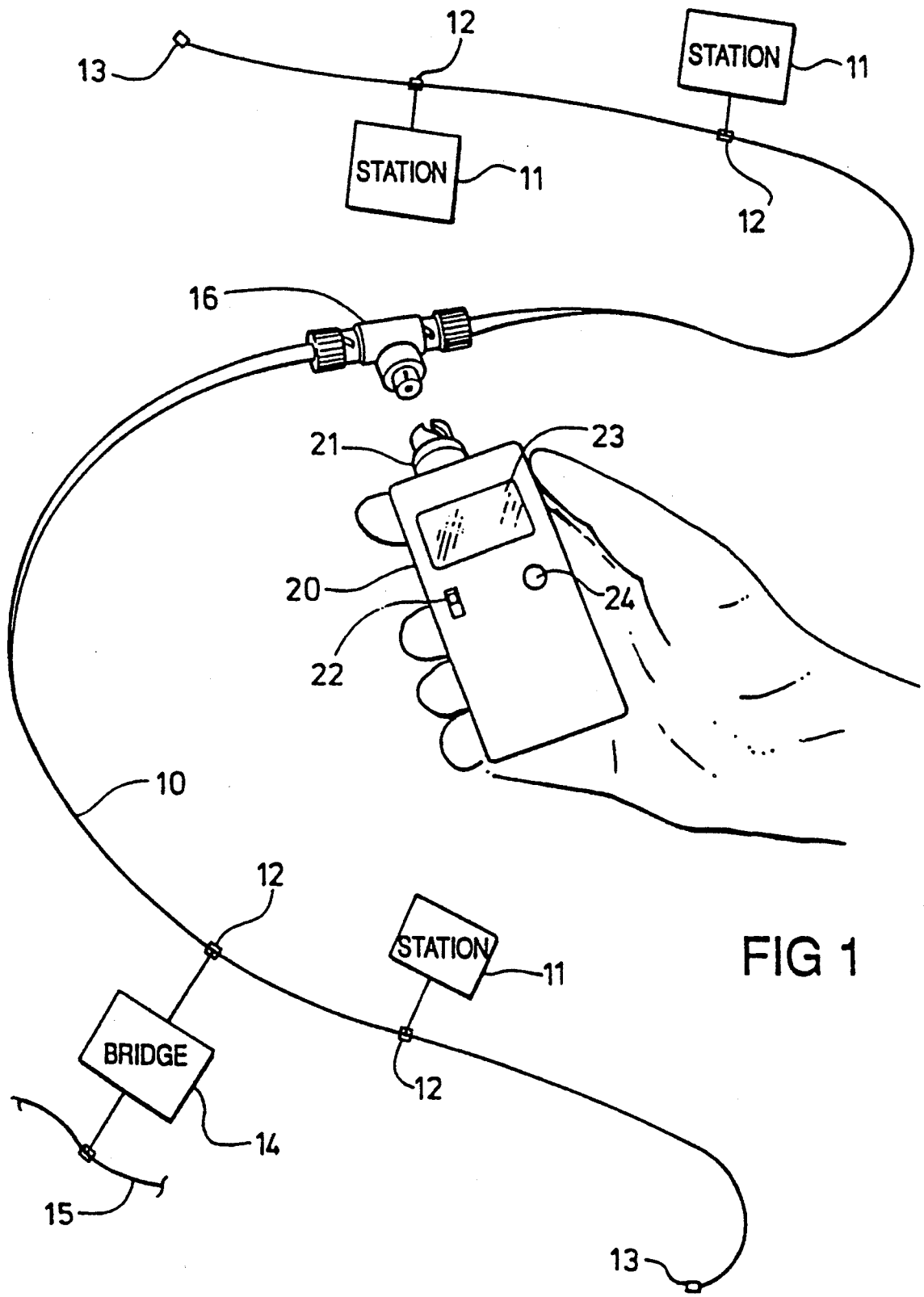
FIG. 1 illustrates generally how the instrument is used to carry out measurements on a LAN.

FIG. 1 illustrates a LAN segment the transmission medium of which is constituted by a coaxial cable 10. A number of computer workstations 11 are connected to the cable 10 via connectors 12. The ends of the cable 10 are terminated by terminators 13 which match the characteristic impedance of the cable 10.

The illustrated LAN is, for example, a CSMA/CD LAN complying with the 10BASE5 variant of the IEEE 802.3 standard. In this case, the characteristic impedance of the coaxial cable 10 is 50 ohms and the terminators 13 can be simply constituted by 50 ohm resistors connected between the inner conductor and the outer shield of the cable. The signalling technique used is baseband with Manchester encoding and with a data rate of 10 megabits/second.

In transmitting packets over the LAN cable, the stations output pulse signals which have negative voltage excursions relative to the voltage of the cable between the packets (in this case, zero volts); thus, the inter-packet voltage will be the peak positive voltage on the cable.

The LAN segment may be connected to one or more other LAN segments 15 via connectors 12 and one or more appropriate spanning devices such as the bridge 14.

Also illustrated in FIG. 1 is the hand-portable LAN parameter-measuring instrument 20. This instrument is battery powered and is provided with a coaxial-cable connector 1 for connecting the instrument to the cable 10 through a T-junction cable connector 16. Such connectors are generally to be found throughout the length of the LAN segment cable 10 and can serve as the connectors 12. When not providing a connection to the cable 10, the connector 16 has its unconnected stub left disconnected.

As can be seen in FIG. 1, the instrument 20 includes a power on/off switch 22, a liquid crystal display (LCD) 23, and a push button switch 24.

Two forms of the internal circuitry of the instrument 20 will now be described with reference to FIGS. 2 and 3.

The first form of circuitry (FIG. 2) utilizes a peak voltage detector to capture the inter-packet voltage on the LAN cable 10, this voltage then being displayed on the LCD 23. More particularly, connecting the instrument 20 to the LAN through the connectors 21 and 16, connects the inner conductor of the cable 10 to an input line 30 of the instrument circuitry. This line 30 is connected to the "+" input of a comparator 31 the output of which feeds, via a diode 32 and a resistor 33, a storage capacitor 34 intended to hold the peak positive voltage of the LAN cable. A resistor 59 permits slow decay of the voltage on the capacitor 34. The voltage held on the capacitor 34 is output via a voltage follower 35 with this output being fed back to the "−" input of the comparator 31. The output of the voltage follower 35 is fed through a scaling potentiometer 36 and a switch member 24A to a digital voltmeter 37 whose output is constituted by the LCD 23. The switch member 24A is part of the switch 24 and in its normal position connects the potentiometer 36 to the digital voltmeter 37.

In operation, if the voltage on line 30 is more positive than the voltage stored on the capacitor 34, then the output of the comparator 31 will go high causing the capacitor 34 to charge up through the diode 32 and resistor 33. As the capacitor 34 charges, its voltage will rise to equal that of the line 30 and thereafter the output of the comparator 31 will go low causing charging of the capacitor 34 to cease. The diode 32 prevents the discharge of the capacitor 34 through the output stage of comparator 31. The output of the comparator 31 will remain low until the voltage on line 30 next exceeds the voltage on the capacitor 34. In this way, the FIG. 2 circuitry acts to capture the peak positive voltage on the inner conductor of the LAN cable 10. As previously noted, data is transmitted over the cable 10 in the form of negative voltage excursions from the inter-packet voltage (that is, zero volts); by capturing the peak positive voltage the FIG. 2 circuitry thus acts to measure the inter-packet voltage on the cable 10.

The presence of the resistor 33 insures that some short term averaging takes place of the peak voltage. This is advantageous as it avoids spurious positive spikes from giving false positive peak readings. In addition, should the voltage pulses used to encode data have small positive excursions as well as their large negative excursions, then by appropriate choice of the value of the resistor 33, these positive excursions can be smoothed out, the mean voltage present during passage of a packet being negative. Of course, the value of the resistor 33 must be such that the voltage on the capacitor 34 tracks to the inter-packet voltage before the end of the minimum inter-packet gap. The resistor 33 can be omitted if no short term averaging is required.

The measurement of the inter-packet voltage is useful in its own right since if this voltage is not zero, it can be concluded that one or more stations is leaking current onto the LAN cable.

The instrument 20 can also be used to measure the resistance of the LAN cable by injecting a small predetermined current into the cable and observing the resultant interpacket voltage. To this end, a current source 38 is provided which when energized by operation of the switch 24 to close a switch member 24B, injects a predetermined current via the line 30 into the LAN cable. The magnitude of this current is chosen such as not to disturb the normal operation of the LAN. The resultant inter-packet voltage measured by the peak-voltage detection circuitry of FIG. 2 provides a measure of the LAN resistance. By feeding the output of the voltage follower 35 via a scaling potentiometer 39 to the digital voltmeter 37, a reading can be produced on the LCD which is a direct reading of the cable resistance. The sealing potentiometer 39 is selected by the operation of the switch 24 which not only closes the switch member 24B but also changes over the switch member 24A from its normal position.

For a properly connected LAN cable, the measured resistance would be just in excess of 25 ohms (the cable terminators constituting two 50 ohm resistors in parallel and the cable itself adding a small amount of resistance).

Measurement of the LAN cable resistance is useful since if a termination 13 is missing, this will be readily apparent from the measurement of the LAN cable resistance.

Figure 3:
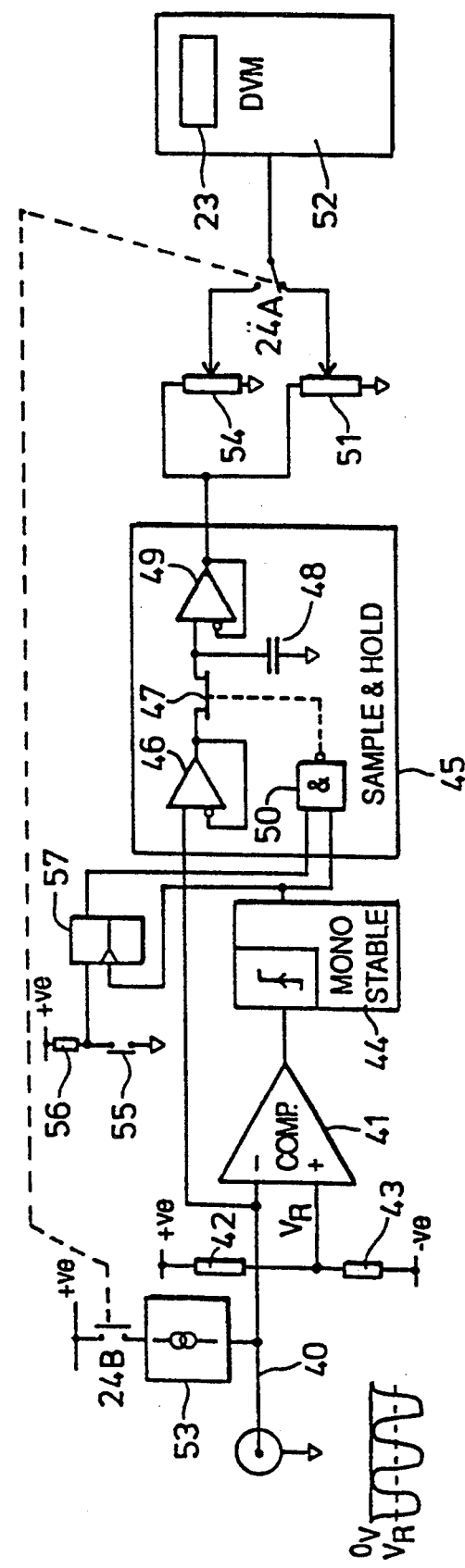
FIG. 3 is a schematic diagram of a second form of measurement circuitry for the LAN instrument.

FIG. 3 shows a second form of circuitry for the instrument 20. The FIG. 3 circuitry uses a sample-and-hold circuit to capture the inter-packet voltage. More particularly, an input line 40 of the circuitry feeds the voltage on the inner conductor of the cable 10 to the inverting input of a fast comparator 41, the non-inverting input of which is fed with a reference voltage $V_R$ provided through a chain of resistors 42, 43. The output of the comparator 41 is low when the voltage on line 40 exceeds the reference voltage $V_R$ but goes high when the voltage on line 40 falls below $V_R$. Thus, in the absence of a packet on the LAN cable 10, the output of the comparator 41 remains low whereas during the passage of a packet each negative data pulse on the cable will cause the voltage of the line 40 to fall below $V_R$ resulting in the output of the comparator 41 going high for the duration of the pulse.

The output of the comparator 41 is connected to a re-triggerable monostable 44 which is triggered off the positive going transitions of the output of the comparator 41 (that is, the monostable will be triggered in correspondence to the leading edge of each negative going data pulse of the cable 10). At each triggering, the monostable 44 starts the output of a positive pulse of a predetermined duration corresponding to three quarters of the minimum inter-packet gap (this minimum being specified in the LAN design specification); if the monostable 44 is re-triggered before the end of a current output pulse, then the pulse is extended by the same predetermined duration.

The output of the monostable 44 is fed to a sample-and-hold circuit 45 and to the clocking input of a D- type flip-flop 57. This sample-and-hold circuit 45 comprises a high impedance input voltage follower 46 fed with the voltage on the line 40, an electronic switch 47, a storage capacitor 48, and an output voltage follower 49. The electronic switch 47 is controlled by the output of a NAND gate 50 such that the switch is closed when the NAND gate output is low and open (the "hold" state) when the NAND gate output is high. The inputs of the NAND gate 50 are connected to the output of the monostable 44 and to an output of the D-type flip-flop 57. The flip-flop 57 is clocked by the rising edge of the pulse generated at the output of the monostable 44, that is, in correspondence with the leading edge of a packet. The flip-flop 57 has its input connected to a pull-up resistor 56 and a switch 55 (not shown in FIG. 1). When the switch 55 is open, the leading edge of a packet will cause the output of the flip-flop to be set high whereas with the switch closed, the leading edge of a packet will cause the output of the flip-flop to be set low. As a result, when the switch 55 is open, the NAND gate 50 will be enabled so that its output will be low when the monostable output is high and vice versa whereby the voltage on the capacitor 48 will follow the LAN voltage during a packet and for a predetermined time interval thereafter but will then hold the inter-packet voltage. However upon closure of the switch 55 by the user of the instrument, the gate 50 will be disabled, causing the output of the gate 50 to go high, and hold the switch 47 open, thereby holding the last-sampled inter-packet voltage on the capacitor 48.

The voltage on the capacitor 48 is fed via the output voltage follower 49, a scaling potentiometer 51 and the switch member 24A, to a digital voltmeter 52 the output of which is constituted by the LCD display 23.

Figure 2:
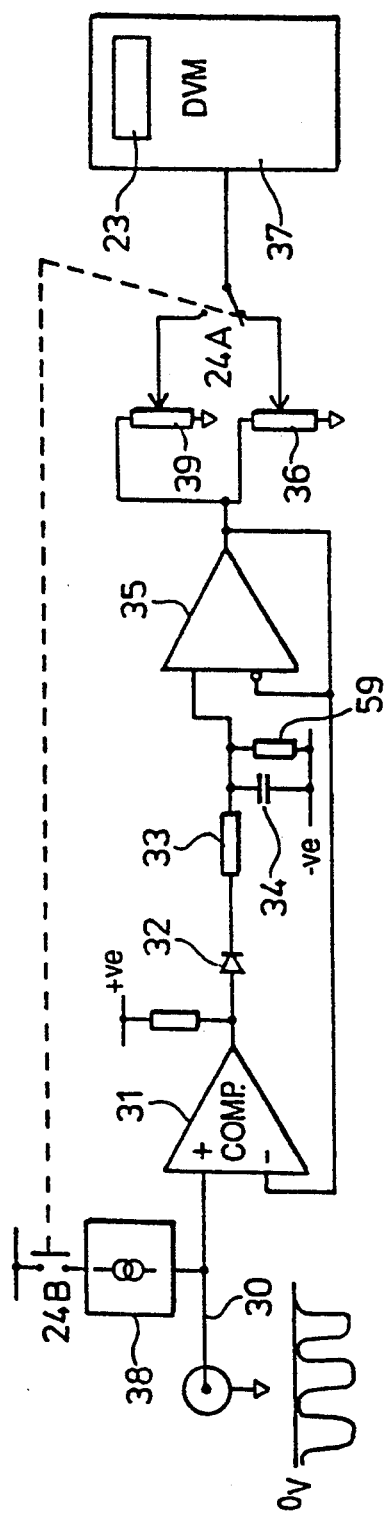
FIG. 2 is a schematic diagram of a first form of measurement circuitry for the LAN instrument.

The sample-and-hold circuitry of FIG. 3 can be used in an equivalent manner to the peak voltage detector circuitry of FIG. 2 for the purposes of measuring the resistance of the LAN. For this purpose, the FIG. 3 circuitry is provided with a current source 53 energizable via a switch member 24B, and a scaling potentiometer 54 selectable by switch member 24A. Operation of the switch 24 serves to inject a current into the LAN and to display the resulting voltage as a resistance reading on the LCD display 23 in the same general manner as for the FIG. 2 circuitry.

It will be appreciated that a number of modifications to the illustrated embodiments are possible. For example, the instrument need not be a hand portable instrument but could be incorporated in a test card to be plugged into a LAN station 11 or a spanning device (bridge 40). It will also be appreciated that the LAN cable upon which measurements are made need not be a coaxial cable but could equally be twisted pair wiring or other transmission media adapted to carry electrical signals.

Furthermore, the derivation of the resistance of the LAN cable can be effected in ways other than by the use of scaling resistors 39, 54; thus, for example, a digital calculation unit could be used which digitized the voltage measured on the LAN upon current injection and thereafter calculated the resistance of the LAN cable, the value of the injected current either being pre-programmed into the calculation device or being separately measured and supplied in digital form to the calculation device.

We claim:

1. An apparatus for measuring at least one physical parameter of a wired, packet-based, baseband LAN, said apparatus comprising:
   (a) input means for providing a connection to a transmission medium of the LAN to enable measurements to be made while the LAN is operational, and
   (b) voltage measuring means, coupled to the LAN transmission medium via said input means for detecting and providing a measure of an inter-packet gap voltage that is present during intervals between packets on the LAN transmission medium.

2. The apparatus of claim 1, wherein said voltage measuring means comprises:
   packet-detecting means for detecting packets on the LAN transmission medium; and sample-and-hold means, controlled by said packet-detecting means, for capturing said inter-packet gap voltage during said intervals.

3. The apparatus of claim 2, wherein said sample-and-hold means samples said inter-packet gap voltage a predetermined time interval after an end of the last preceding packet detected by said packet-detecting means.

4. The apparatus of claim 1, wherein said voltage measuring means comprises a peak voltage detector operative to capture a peak voltage on the LAN transmission medium in a direction opposite to a direction of excursion of a mean voltage of the LAN transmission medium during passage of a packet relative to a mean voltage between packets on the LAN transmission medium.

5. The apparatus of claim 4, wherein said peak voltage detector records an instantaneous peak voltage on the LAN transmission medium.

6. The apparatus of claim 4, wherein said peak voltage detector records the peak voltage integrated over a period sufficient to smooth out peaks during passage of one of said packets but short enough to permit tracking to the inter-packet gap voltage during said intervals between packets.

7. The apparatus of claim 1, further comprising:
   current injection means of injecting a known current into the LAN transmission medium and
   processor means connected to said voltage measuring means for determining a resistance presented by the LAN transmission medium in response to said inter-packet gap voltage, measured while said current injection means inject said known current, and to a magnitude of said known current.

8. The apparatus of claim 7, wherein said processor means is a scaling resistance.

9. The apparatus of claim 1 wherein said voltage measuring means is assembled within a hand-held instrument.

10. A method for measuring at least one physical parameter of a wired, packet-based, baseband LAN, comprising the steps of:
    providing a connection to a transmission medium of the LAN to enable measurements to be made while the LAN is operational; and
    measuring an interpacket gap voltage that is present on the LAN transmission medium during intervals between packets on the LAN transmission medium.

11. The method of claim 10, further comprising the step of:
    capturing and holding said interpacket gap voltage.

12. The method of claim 1, wherein said measuring step comprises detecting packets with a packet-detecting means for detecting packets on the LAN transmission medium, and said capturing and holding steps includes utilizing a sample-and-hold circuit to capture and hold said inter-packet gap voltage during said intervals.

13. The method of claim 11, wherein said capturing and holding step further comprises recording, with a peak voltage detector operative to capture a peak voltage on the LAN transmission medium in a direction opposite to a direction of excursion of a mean voltage of the LAN transmission medium during passage of a packet relative to a mean voltage between packets on the LAN transmission medium, an instantaneous peak voltage on the LAN transmission medium.

14. The method of claim 11, wherein said capturing and holding step further comprises recording, with a peak voltage detector operative to capture a peak voltage on the LAN transmission medium in a direction opposite to a direction of excursion of a mean voltage of the LAN transmission medium during passage of a packet relative to a mean voltage between packets on the LAN transmission medium, the peak voltage integrated over a period sufficient to smooth out peaks during passage of one of said packets but short enough to permit tracking to the inter-packet gap voltage during said intervals between packets.

15. The method of claim 10 further comprising the steps of:
   injecting a known current into the LAN transmission medium; and
   determining a resistance presented by the LAN transmission medium in response to said inter-packet gap voltage, measured while said known current is being injected, and to a magnitude of said known current.

16. A method for measuring at least one physical parameter of a wired, packet-based, baseband LAN, comprising the steps of:
   providing a connection to a transmission medium of the LAN to enable measurements to be made while the LAN is operational;
   coupling, to said connection, a voltage measuring means for detecting and providing a measure of the at least one physical parameter of the LAN; and
   detecting and capturing, with said voltage measuring means, an inter-packet gap voltage that is present during intervals between packets on the LAN transmission medium.

* * * * *